US011380829B2

(12) United States Patent
Ting et al.

(10) Patent No.: US 11,380,829 B2
(45) Date of Patent: Jul. 5, 2022

(54) LIGHT EMITTING DEVICE AND LIGHT EMITTING DEVICE ASSEMBLY

(71) Applicant: XIAMEN SAN'AN OPTOELECTRONICS CO., LTD., Xiamen (CN)

(72) Inventors: Shao-Ying Ting, Xiamen (CN); Junfeng Fan, Xiamen (CN); Chia-En Lee, Xiamen (CN); Chen-Ke Hsu, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 68 days.

(21) Appl. No.: 16/947,770

(22) Filed: Aug. 17, 2020

(65) Prior Publication Data
US 2020/0381603 A1    Dec. 3, 2020

Related U.S. Application Data

(63) Continuation-in-part of application No. PCT/CN2018/085675, filed on May 4, 2018.

(51) Int. Cl.
*H01L 33/62* (2010.01)
*H01L 27/15* (2006.01)
*H01L 33/40* (2010.01)
*H01L 33/60* (2010.01)

(52) U.S. Cl.
CPC ............ *H01L 33/62* (2013.01); *H01L 27/156* (2013.01); *H01L 33/40* (2013.01); *H01L 33/60* (2013.01)

(58) Field of Classification Search
None
See application file for complete search history.

(56) References Cited

U.S. PATENT DOCUMENTS

2005/0175053 A1*   8/2005   Kimura ................. H01S 5/4031
                                                                  372/50.12

FOREIGN PATENT DOCUMENTS

CN           1645695 A      7/2005

OTHER PUBLICATIONS

Search Report issued to PCT Application No. PCT/CN2018/085675 by the WIPO dated Feb. 11, 2019.

* cited by examiner

*Primary Examiner* — Robert K Carpenter
(74) *Attorney, Agent, or Firm* — Rosenberg, Klein & Lee

(57) ABSTRACT

A light emitting device includes a light emitting structure, first and second electrodes, and a shielding layer. The light emitting structure includes a first-type semiconductor layer, an active layer, and a second-type semiconductor layer that are stacked along a stacking direction in such order. The first electrode is electrically connected to the first-type semiconductor layer. The second electrode is electrically connected to the second-type semiconductor layer. The shielding layer is connected to aside of the light emitting structure and is adapted to absorb or reflect incident laser light.

24 Claims, 5 Drawing Sheets

LIGHT EMITTING DEVICE AND LIGHT EMITTING DEVICE ASSEMBLY

CROSS-REFERENCE TO RELATED APPLICATION

This application is a bypass continuation-in-part application of PCT International Application No. PCT/CN2018/085675 filed on May 4, 2018. The entire content of the international patent application is incorporated herein by reference.

FIELD

The disclosure relates to a semiconductor device, and more particularly to a light emitting device and a light emitting device assembly.

BACKGROUND

Nowadays, it is desirable to produce a light emitting device including a plurality of light emitting structures with small spaces thereamong so as to achieve miniaturization and high resolution. In making the light emitting device, sapphire substrates are often used and need to be removed by various techniques, such as a laser lift-off process. However, during the lift-off process, the laser might penetrate through the sapphire substrates and then transmitted to a circuit control board underneath the sapphire substrate, causing damage to the circuit control board.

SUMMARY

Therefore, a first aspect of the present disclosure is to provide a light emitting device, which includes alight emitting structure, a first electrode, a second electrode, and a shielding layer.

The light emitting substrate includes a first-type semiconductor layer, an active layer, and a second-type semiconductor layer that are stacked along a stacking direction in such order. The first electrode is electrically connected to the first-type semiconductor layer. The second electrode is electrically connected to the second-type semiconductor layer. The shielding layer is connected to a side of the light emitting structure and is adapted to absorb or reflect incident laser light.

A second aspect of the present disclosure is to provide a light emitting device assembly, which includes a substrate, at least one light emitting structure, at least one first electrode, at least one second electrode, a sacrifice structure, and a shielding layer.

The substrate has a control circuit. The at least one light emitting structure is connected to the substrate and is electrically connected to the control circuit. The at least one light emitting structure includes a first-type semiconductor layer, a second-type semiconductor structure, and an active layer disposed between the first-type and second-type semiconductor layers. The at least one first electrode is electrically connected to the first-type semiconductor layer. The at least one second electrode is electrically connected to the second-type semiconductor layer. The sacrifice structure is connected to the substrate and is adjacent to the at least one light emitting structure. The shielding layer is disposed on the substrate and is connected to the sacrifice structure.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
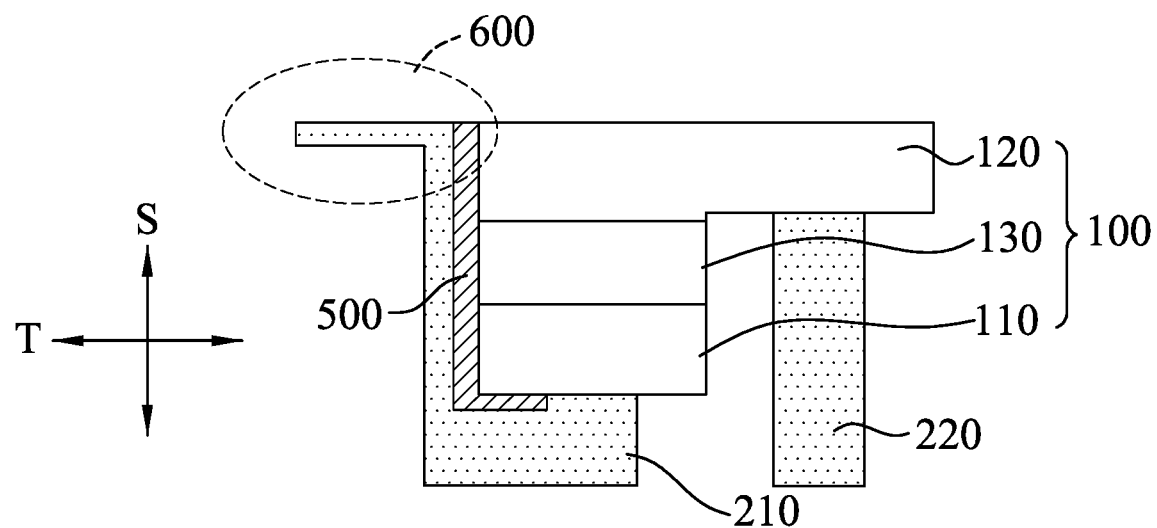
FIG. 1 is a side view of a first embodiment of a light emitting device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a light emitting device according to the present disclosure includes a light emitting structure 100, a first electrode 210, a second electrode 220, an electrical insulation layer 500, and a shielding layer 600.

The light emitting structure 100 includes a first-type semiconductor 110, an active layer 130, and a second-type semiconductor layer 120 that are stacked along a stacking direction (S) in such order. The first electrode 210 is electrically connected to the first-type semiconductor layer 110. The second electrode 220 is electrically connected to the second-type semiconductor layer 120. The electrical insulation layer 500 is disposed between the light emitting structure 100 and the first electrode 210 to prevent the first electrode 210 from electrically connecting to the second-type semiconductor layer 120. The shielding layer 600 is connected to a side of the light emitting structure 100 and is adapted to absorb or reflect incident laser light.

In this embodiment, the first-type semiconductor 110 is a P-type semiconductor, and the second-type semiconductor layer 120 is an N-type semiconductor. The shielding layer 600 may extend outwardly from the light emitting structure 100 along a transverse direction (T) which intersects the stacking direction (S). In this embodiment, the stacking direction (S) and the transverse direction (T) are perpendicular to each other. For simplifying the manufacturing process, the shielding layer 600 may be made of a material the same as a material of the first electrode 210 and/or the material of the second electrode 220. In other words, the shielding layer 600 may be further connected to one of the first electrode 210 and the second electrode 220. In this embodiment, the shielding layer 600 and the first electrode 210 are made of the same material and are integrally formed as one piece. The first electrode 210 or the second electrode 220 may be made of layers of different materials stacked together along the stacking direction (S) or the transverse direction (T).

When the shielding layer 600 is made of a reflective material, the shielding layer 600 absorbs less laser energy during ablation of a carrier 400 (see FIG. 3, which will be described in details hereinafter), which prevents the light emitting device from being damaged due to increased temperature caused by absorbing laser. The shielding layer 600 may have a reflectivity of greater than 50% for the incident laser light. In certain embodiments, the incident laser light has a wavelength of 248 nm, 266 nm, etc. In certain embodiments, each of the first electrode 210, the second electrode 220, and the shielding layer 600 may be made of a material selected from the group consisting of chromium, titanium, nickel, aluminum, silver, gold, platinum, tin, and combinations thereof. In another embodiment, each of the first electrode 210, the second electrode 220, and the shielding layer 600 may be made of silicon dioxide-containing materials, such as glass.

This disclosure is suitable for different types of light emitting device, such as face-up light emitting device, flip-chip light emitting device, vertical light emitting device, etc.

Figure 2:
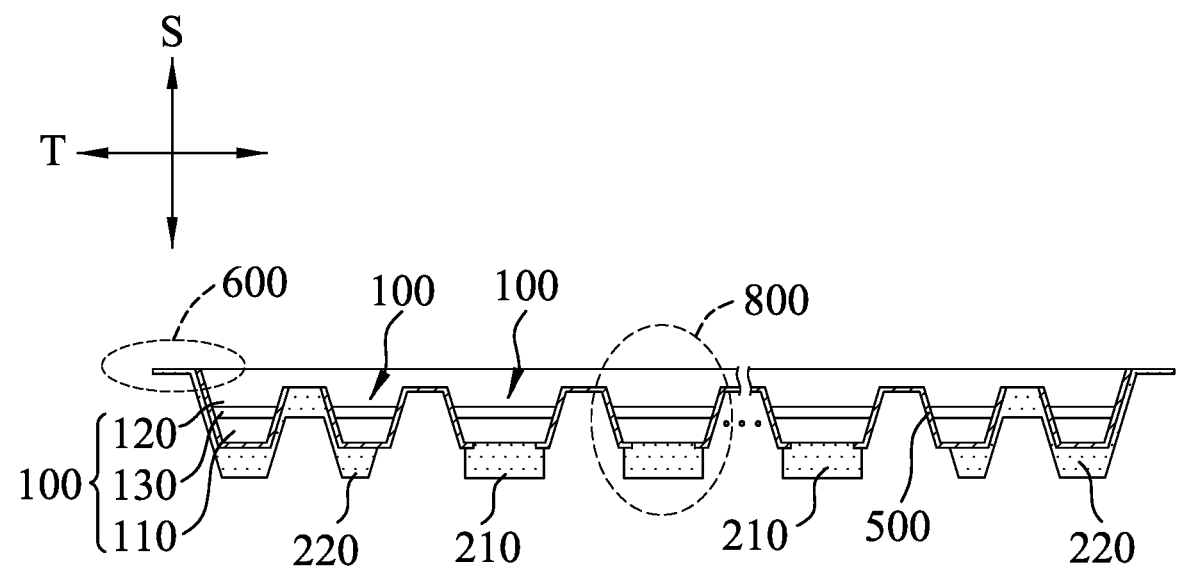
FIG. 2 is a fragmentary side view of a second embodiment of the light emitting device according to the present disclosure, the second embodiment including a plurality of light emitting structures.

Referring to FIG. 2, a second embodiment of the light emitting device of this disclosure includes a plurality of the light emitting structures 100, a plurality of the first electrodes 210, and a plurality of the second electrodes 220. Each of the first electrodes 210 is electrically connected to the first-type semiconductor layer 110 of a corresponding one of the light emitting structures 100. Each of the second electrodes 220 is electrically connected to the second-type semiconductor layer 120 of a corresponding one of the light emitting structures 100. The shielding layer 600 surrounds the light emitting structures 100. In this embodiment, the light emitting device has a dimension measured along the transverse direction (T) which is greater than 1 mm×1 mm. Each of the light emitting structures 100 may serve as an individually controllable pixel 800.

In this embodiment, each of the light emitting structures 100 has a length and a width measured along directions (one of which is transverse direction (T)) perpendicular to the stacking direction (S) that ranges from 2 μm to 100 μm, and a height measured along the stacking direction (S) that ranges from 2 μm to 100 μm. For example, the length of the light emitting structures 100 may range from 2 μm to 5 μm, from 5 μm to 10 μm, from 10 μm to 20 μm, from 20 μm to 50 μm, or from 50 μm to 100 μm, the width of each of the light emitting structures 100 may range from 2 μm to 5 μm, from 5 μm to 10 μm, from 10 μm to 20 μm, from 20 μm to 50 μm, or from 50 μm to 100 μm, and the height of each of the light emitting structures 100 may range from 2 μm to 5 μm, from 5 μm to 10 μm, from 10 μm to 20 μm, from 20 μm to 50 μm, or from 50 μm to 100 μm.

Figure 3:
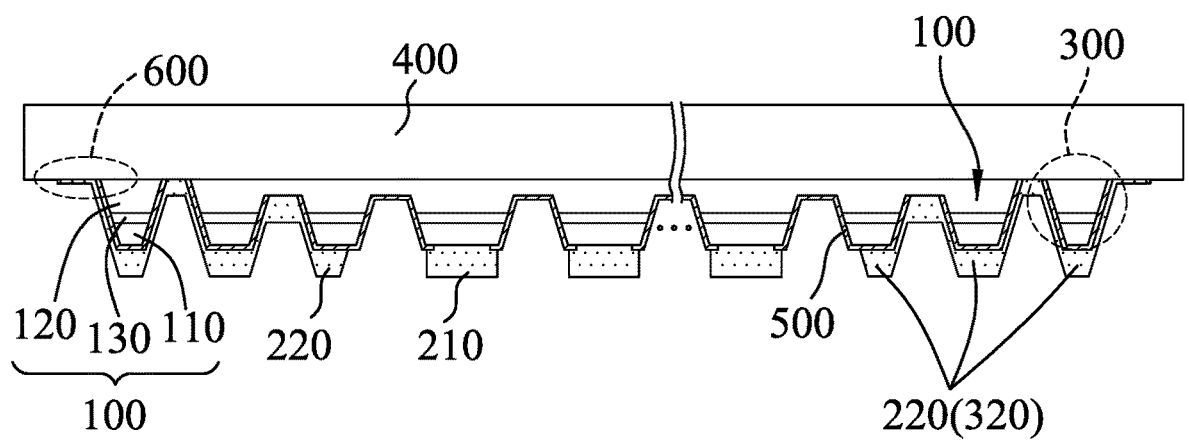
FIG. 3 shows a variation of the second embodiment.

Referring to FIG. 3, in a variation of the second embodiment, the light emitting device further includes a sacrifice structure 300 that is adjacent to one of the light emitting structures 100 for reducing or preventing cracks from propagating to the light emitting structure 100 when the light emitting device is removed from a temporary carrier (i.e., the carrier 400). The sacrifice structure 300 may have a structure similar to that of the light emitting structure 100. In other words, the sacrifice structure 300 and the light emitting structure 100 may be formed at the same time, thereby reducing manufacturing costs. In this embodiment, a difference between a height of the sacrifice structure 300 measured along the stacking direction (S) and a height of the light emitting structure 100 measured along the stacking direction (S) is not greater than 1 μm. The height difference may be adjusted so that the light emitting structure 100 can be properly and securely connected to a substrate (such as a substrate 700 shown in FIG. 8). Apart of the first electrode 210 or the second electrode 220 may serve as a supporting structure. In this embodiment, a part of the second electrode 220 is configured as the supporting structure 320 for facilitating connection between the light emitting structure 100 and the substrate 700. In this embodiment, the sacrifice structure 300 is electrically isolated from the light emitting structure 100. The sacrifice structure 300 may have a width measured along the transverse direction (T) that is greater than a height of the sacrifice structure 300 measured along the stacking direction (S). A surface area of the sacrifice structure 300 may account for a percentage ranging from 1% to 10% of a light-emitting surface of the light emitting structure 100. The percentage may be adjusted according to practical requirements for achieving optimal lighting efficiency.

In this embodiment, the sacrifice structure 300 has a side wall that is located away from the light emitting structure 100 and that is flat, and/or one of the light emitting structures 100 has a side wall that is adjacent to the shielding layer 600 and that is flat, thereby improving the overall structural stability. The flat walls allow the second electrode 220 and the shielding layer 600 to be securely formed.

Figure 4:
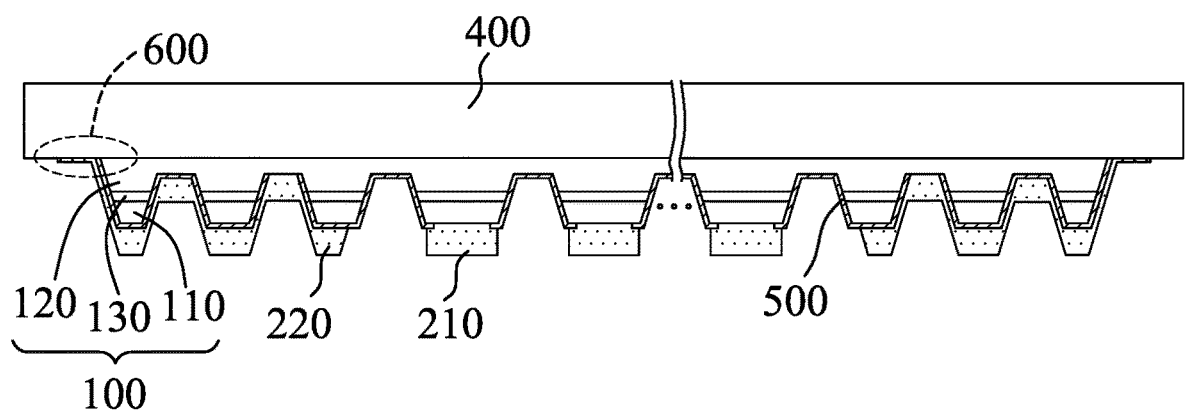
FIG. 4 shows another variation of the second embodiment.

Referring to FIG. 4, in another variation of the second embodiment, the sacrifice structure 300 is connected to the second-type semiconductor layer 120 of the light emitting structure 100. With such minimal connection between the sacrifice structure 300 and the light emitting structure 100, the sacrifice structure 300 is capable of effectively preventing cracks from propagating to the light emitting structure 100.

It should be noted that the light emitting devices of the first embodiment, the second embodiment and the variations thereof may be assembled in combinations for different practical applications.

Figure 5:
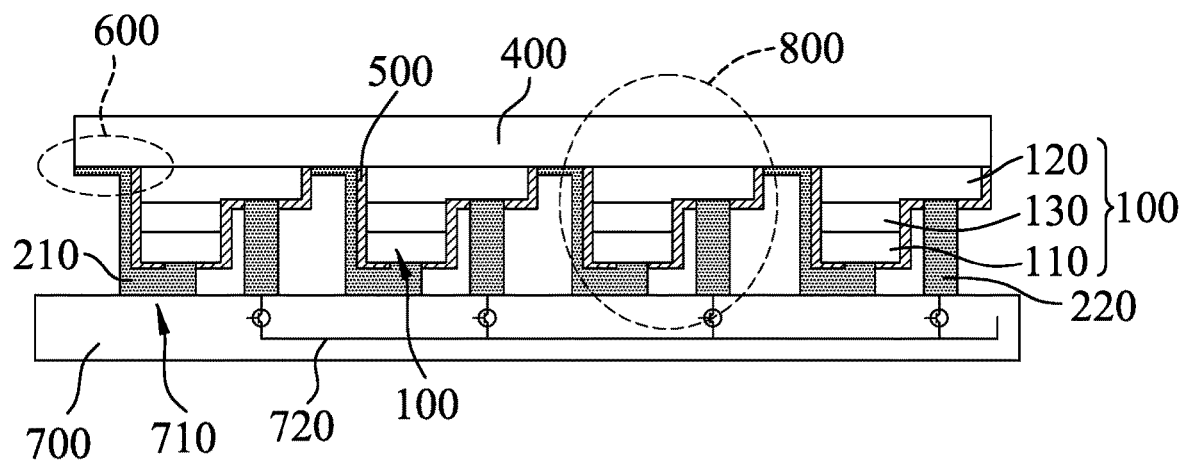
FIG. 5 is a side view of a third embodiment of the light emitting device according to the present disclosure.

Referring to FIG. 5, in a third embodiment of the light emitting device of this disclosure, the substrate 700 is further connected to the light emitting structures 100. The substrate 700 has a contact region 710 for electrically connecting to the first electrodes 210 and the second electrodes 220 of the light emitting structures 100, and a control circuit 720 which is operable to control operation of the light emitting structures 100. During operation, electrons are injected into the light emitting structures 100 via the contact region 710 of the substrate 700, and the control circuit 720 is operated to control lighting modes of the light emitting structures 100, such that the light emitting device achieves a high resolution. In this embodiment, at least a part of the shielding layer 600, especially at regions among the light emitting structures 100, is aligned with the control circuit 720 along the stacking direction (S), thereby preventing the incident laser light from directly irradiating through the carrier 400 onto the control circuit 720 and damaging the control circuit 720. In this embodiment, the control circuit 720 is an active matrix-type, and includes a plurality of individually controllable switches, each of which may be a field effect transistor, such as a thin-film transistor. In certain embodiments, the control circuit 720 includes a plurality of CMOS devices that are individually controllable to respectively control the light emitting structures 100.

It should be noted that the contact region 710 may also dissipate heat generated by the light emitting structures 100 through the substrate 700 to improve heat dissipation of the light emitting device, and may serve to support the light emitting structures 100 so as to improve the overall structural integrity of the light emitting device.

Figure 6:
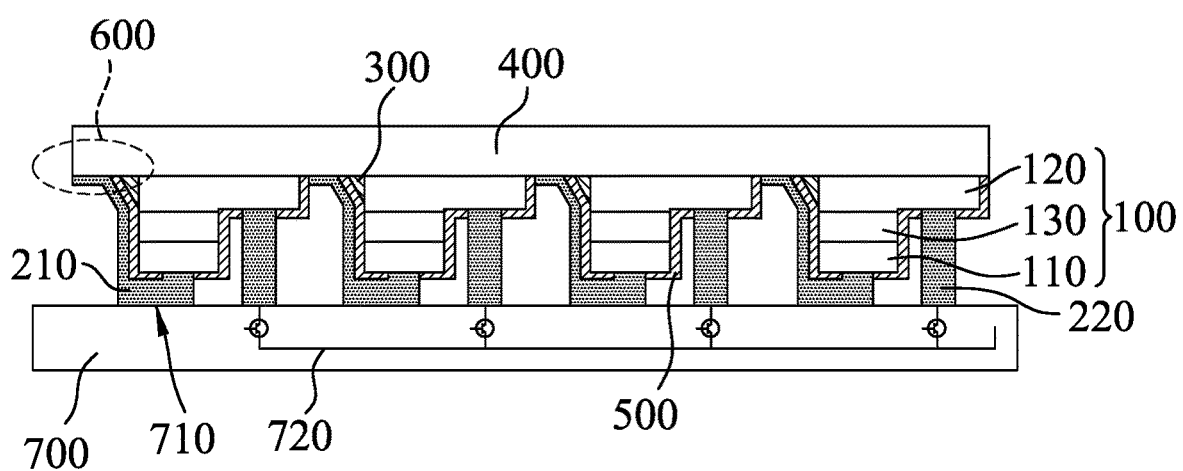
FIG. 6 is a side view of a fourth embodiment of the light emitting device according to the present disclosure.

Referring to FIG. 6, in a fourth embodiment of the light emitting device of this disclosure, the sacrifice structure 300 is disposed between the light emitting structures 100 and the electrical insulation layer 500, and is also capable of preventing cracks from propagating to the light emitting structure 100. In this embodiment, the sacrifice structure 300 may be made of polymer.

Figure 7:
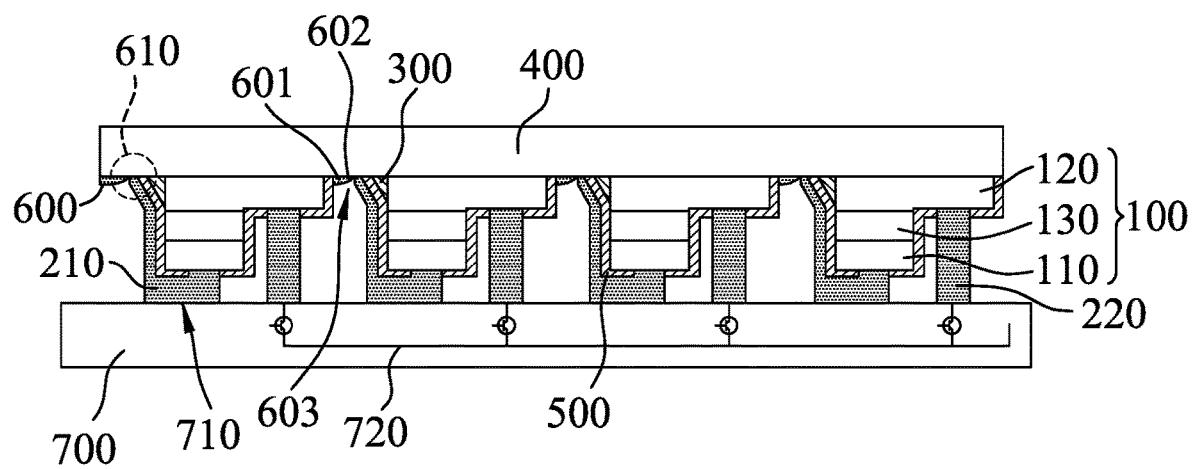
FIG. 7 is a side view of a fifth embodiment of the light emitting device according to the present disclosure.

Referring to FIG. 7, in a fifth embodiment of the light emitting device of this disclosure, the shielding layer 600 has a stress concentration region 610, and has a uniform profile except for the stress concentration region 610. In this embodiment, the shielding layer 600 has a first portion 601 that is spaced apart from the light emitting structure 100, and a second portion 602 that is connected between the first portion 601 and the light emitting structure 100. The second portion 602 has a thickness that is measured along the stacking direction (S) and that is smaller than that of the first portion 601. The stress concentration region 610 is located at the second portion 602. The stress concentration region 610 also serves to prevent cracks from propagating to the light emitting structure 100. In this embodiment, the stress concentration region 610 is spaced apart from a closest light emitting structure 100 in a distance smaller than 1 mm. It should be noted that, besides variation in the thickness of the shielding layer 600, the stress concentration region 610 may be formed by changing the shape of the shielding layer 600, forming a recess in the shielding layer 600, etc. For example, the second portion 602 of the shielding layer 600 may define a recess 603 that indents relative to the first portion 601 and that serves as the stress concentration region 610.

Figure 8:
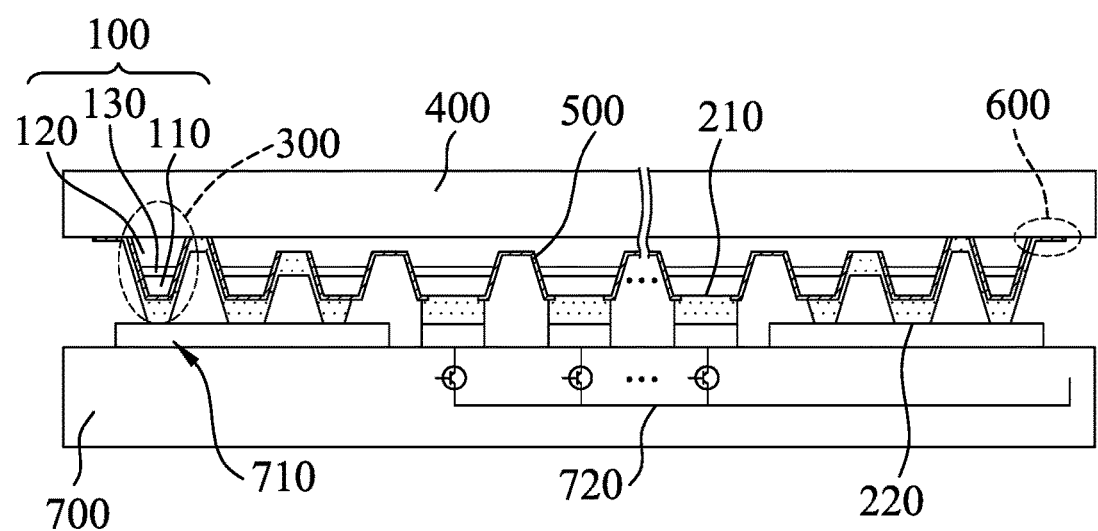
FIG. 8 shows a side view of an application of the variation of the second embodiment shown in FIG. 3.

FIG. 8 shows an exemplary application of the variation of the second embodiment of the light emitting device shown in FIG. 3, in which the light emitting device is connected to the carrier 400 and the substrate 700. The light emitting structures 100 are electrically connected to the contact region 710 of the substrate 700, and are independently controllable by the control circuit 720. By having the flat side wall of the light emitting structure 100 adjacent to the shielding layer 600 and the flat side wall of the sacrifice structure 300, the second electrodes 220 and the shielding layer 600 can be securely formed. Moreover, the light emitting structures 100 can be supported by the second electrodes 220 and the substrate 700 to improve the overall structural integrity of the light emitting device.

Figure 9:
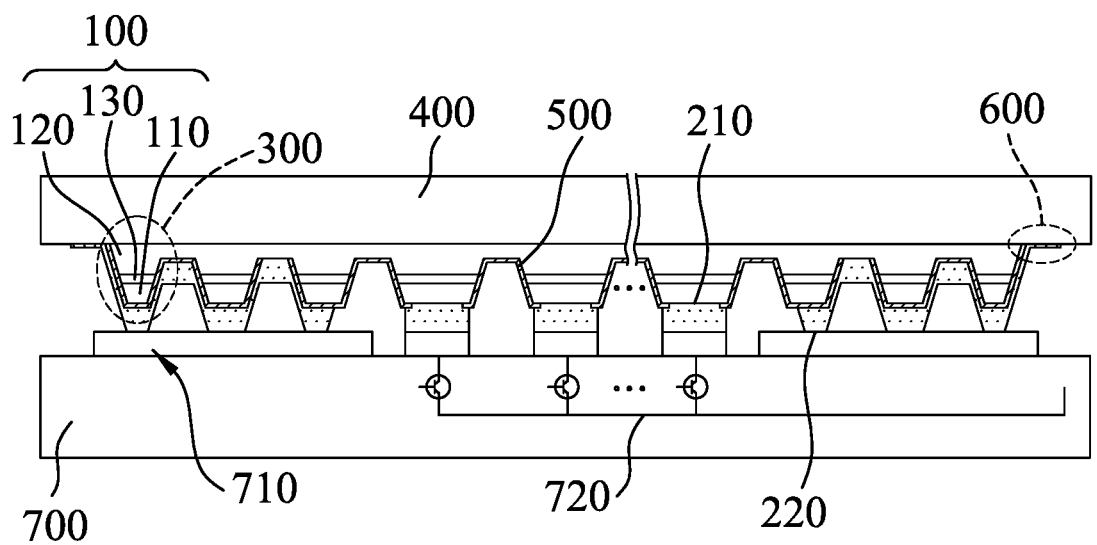
FIG. 9 shows a side view of an application of the second embodiment shown in FIG. 2.

FIG. 9 is similar to FIG. 8, but shows an exemplary application of the second embodiment of the light emitting device shown in FIG. 2.

Figure 10:
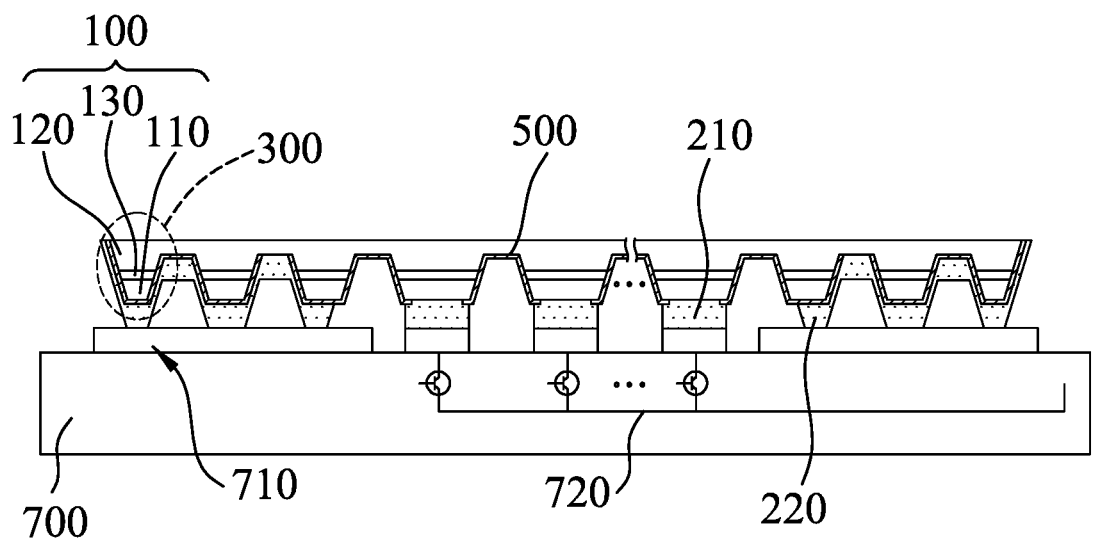
FIG. 10 is a side view of a light emitting device assembly according to the present disclosure.

FIG. 10 shows a light emitting device assembly, which is made by removing the carrier 400 of the light emitting device shown in FIG. 9. The removal of the carrier 400 eliminates the adverse effect of the carrier 400 on the lighting quality of the light emitting device, thereby improving contrast ratio and resolution of the light emitting device. In certain embodiments, the shielding layer 600 breaks at the stress concentration region 610 (see FIG. 7). Therefore, the shielding layer 600 is almost non-existent on the light emitting device after removal of the carrier 400. In certain embodiments, the sacrifice structure 300 may be removed from the light emitting device with the removal of the carrier 400.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. A light emitting device, comprising:
   a light emitting structure including a first-type semiconductor layer, an active layer, and a second-type semiconductor layer that are stacked along a stacking direction in such order;
   a first electrode that is electrically connected to said first-type semiconductor layer;
   a second electrode that is electrically connected to said second-type semiconductor layer; and
   a shielding layer that is connected to a side of said light emitting structure and adapted to absorb or reflect incident laser light, and said shielding layer has a stress concentration region, said shielding layer having a uniform profile except for said stress concentration region.

2. The light emitting device as claimed in claim 1, wherein said shielding layer extends outwardly from said light emitting structure along a transverse direction which intersects the stacking direction.

3. The light emitting device as claimed in claim 1, wherein said shielding layer has a reflectivity of greater than 50% for the incident laser light.

4. The light emitting device as claimed in claim 1, wherein said shielding layer is made of a material the same as a material of said first electrode or a material of said second electrode.

5. The light emitting device as claimed in claim 1, wherein said shielding layer is further connected to one of said first electrode and said second electrode.

6. The light emitting device as claimed in claim 1, wherein said shielding layer is made of a material selected from the group consisting of chromium, titanium, nickel, aluminum, silver, gold, platinum, tin, and combinations thereof.

7. The light emitting device as claimed in claim 1, wherein:
   said shielding layer has a first portion that is spaced apart from said light emitting structure, and a second portion that is connected between said first portion and said light emitting structure;

said second portion has a thickness that is measured along the stacking direction and that is smaller than that of said first portion; and said stress concentration region is located at said second portion.

8. The light emitting device as claimed in claim 7, wherein said second portion defines a recess that indents relative to said first portion and that serves as said stress concentration region.

9. The light emitting device as claimed in claim 1, wherein said stress concentration region is spaced apart from said light emitting structure in a distance smaller than 1 mm.

10. The light emitting device as claimed in claim 1, wherein:
said light emitting device comprises a plurality of said light emitting structures, a plurality of said first electrodes and a plurality of said second electrodes;
each of said first electrodes is electrically connected to said first-type semiconductor layer of a corresponding one of said light emitting structures;
each of said second electrodes is electrically connected to said second-type semiconductor layer of a corresponding one of said light emitting structures;
said shielding layer surrounds said light emitting structures; and
said light emitting device has a dimension measured along the transverse direction which is greater than 1 mm×1 mm.

11. The light emitting device as claimed in claim 1, further comprising a sacrifice structure that is adjacent to said light emitting structure for reducing or preventing cracks from propagating to said light emitting structure when said light emitting device is removed from a temporary carrier.

12. The light emitting device as claimed in claim 11, wherein said sacrifice structure has a side wall that is located away from said light emitting structure and that is flat.

13. The light emitting device as claimed in claim 11, wherein said sacrifice structure is electrically isolated from said light emitting structure or is connected to said second-type semiconductor layer of said light emitting structure.

14. The light emitting device as claimed in claim 11, wherein a difference between a height of said sacrifice structure measured along the stacking direction and a height of said light emitting structure measured along the stacking direction is not greater than 1 μm.

15. The light emitting device as claimed in claim 11, wherein said sacrifice structure has a width measured along the transverse direction that is greater than a height of said sacrifice structure measured along the stacking direction.

16. The light emitting device as claimed in claim 11, wherein a surface area of said sacrifice structure accounts for a percentage that ranges from 1% to 10% of a light-emitting surface of said light emitting structure.

17. The light emitting device as claimed in claim 1, wherein said light emitting structure has a width measured along the transverse direction that ranges from 2 μm to 100 μm.

18. The light emitting device as claimed in claim 1, wherein said light emitting structure has a height measured along the stacking direction that ranges from 2 μm to 100 μm.

19. The light emitting device as claimed in claim 1, wherein said light emitting structure has a side surface that is adjacent to said shielding layer and that is flat.

20. The light emitting device as claimed in claim 1, further comprising a substrate that is connected to said light emitting structure, and that has a control circuit which is operable to control operation of said light emitting structure.

21. The light emitting device as claimed in claim 20, wherein at least a part of said shielding layer is aligned with said control circuit along the stacking direction.

22. The light emitting device as claimed in claim 20, wherein said control circuit of said substrate includes at least one CMOS device.

23. A light emitting device assembly, comprising:
a substrate having a control circuit;
at least one light emitting structure that is connected to said substrate and that is electrically connected to said control circuit, said at least one light emitting structure including a first-type semiconductor layer, a second-type semiconductor structure, and an active layer disposed between said first-type and second-type semiconductor layers;
at least one first electrode that is electrically connected to said first-type semiconductor layer;
at least one second electrode that is electrically connected to said second-type semiconductor layer;
a sacrifice structure that is connected to said substrate and that is adjacent to said at least one light emitting structure; and
a shielding layer that is disposed on said substrate and connected to said sacrifice structure, and said shielding layer has a stress concentration region, said shielding layer having a uniform profile except for said stress concentration region.

24. A light emitting device, comprising:
a light emitting structure including a first-type semiconductor layer, an active layer, and a second-type semiconductor layer that are stacked along a stacking direction in such order;
a first electrode that is electrically connected to said first-type semiconductor layer;
a second electrode that is electrically connected to said second-type semiconductor layer;
a sacrifice structure that is adjacent to said light emitting structure for reducing or preventing cracks from propagating to said light emitting structure when said light emitting device is removed from a temporary carrier; and
a shielding layer that is connected to a side of said light emitting structure and adapted to absorb or reflect incident laser light.

* * * * *